United States Patent [19]
Galvin-Donoghue et al.

[11] Patent Number: 5,958,654
[45] Date of Patent: Sep. 28, 1999

[54] LITHOGRAPHIC PROCESS AND ENERGY-SENSITIVE MATERIAL FOR USE THEREIN

[75] Inventors: Mary Ellen Galvin-Donoghue, Titusville; Francis Michael Houlihan, Millington; Janet Mihoko Kometani, Warren; Omkaram Nalamasu, Basking Ridge, all of N.J.; Thomas Xavier Neenan, Boston, Mass.

[73] Assignee: Lucent Technologies Inc., Murray Hill, N.J.

[21] Appl. No.: 08/918,781

[22] Filed: Aug. 25, 1997

[51] Int. Cl.$^6$ .................................................. G03F 7/00
[52] U.S. Cl. ..................... 430/313; 430/270.1; 430/330
[58] Field of Search ............................. 430/313, 270.1, 430/323, 325, 330

[56] References Cited

U.S. PATENT DOCUMENTS

| | | | |
|---|---|---|---|
| 4,491,628 | 1/1985 | Ito et al. | 430/176 |
| 4,939,070 | 7/1990 | Brunsvold et al. | 430/312 |
| 4,996,136 | 2/1991 | Houlihan et al. | 430/313 |
| 5,350,660 | 9/1994 | Urano et al. | 430/270.1 |
| 5,385,809 | 1/1995 | Bohrer et al. | 430/311 |
| 5,403,695 | 4/1995 | Hayase et al. | 430/270.1 |
| 5,468,589 | 11/1995 | Urano et al. | 430/270.1 |
| 5,523,370 | 6/1996 | Watanabe et al. | 430/270.1 |
| 5,625,020 | 4/1997 | Breyta et al. | 430/270.1 |
| 5,658,706 | 8/1997 | Niki et al. | 430/270.1 |
| 5,733,704 | 3/1998 | Choi et al. | 430/270.1 |
| 5,756,266 | 5/1998 | Galvin-Donoghue et al. | 430/323 |

OTHER PUBLICATIONS

"An Overview of Photoacid Generator Design for Acetal Resist Systems", by Houlihan, F.M. et al., pp. 1–8.
"Acid Labile Crosslinked Units: A New Concept for Deep–UV Photoresists", by Schacht, H. T., et al., *Journal of Photopolymer Science and Technology*, vol. 9, No. 4, pp. 573–586 (1996).

*Primary Examiner*—Kathleen Duda
*Attorney, Agent, or Firm*—Richard J. Botos

[57] ABSTRACT

A process for device fabrication is disclosed. In the process, an energy sensitive material is formed on a substrate. The energy sensitive resist material contains a polymer or a polymer blend in combination with an energy-sensitive material such as a photoacid generator. At least three substituents are distributed on the polymer blend. The first of these substituents is a hydroxyl (OH) group. The second of these substituents is an acid-sensitive or acid labile group which is cleaved in the presence of acid and replaced by an OH group. The third of these substituents forms hydrogen bonds with the first group. The ratio of the number of OH substituents relative to the number of substituents that hydrogen bond to the OH substituents (mole percent) is about 40:1 to at least about 1:1. The relative amounts of the first and third substituents is selected to provide a resist material with a glass transition temperature of at least about 60°. After a layer of the energy sensitive resist material is formed on the substrate, an image of a pattern is introduced into the energy-sensitive material via a patternwise exposure to radiation. The image is thereafter developed into a pattern, and transferred into the underlying substrate.

9 Claims, No Drawings

LITHOGRAPHIC PROCESS AND ENERGY-SENSITIVE MATERIAL FOR USE THEREIN

BACKGROUND OF THE INVENTION

1. Technical Field

This invention relates to lithographic processes for semiconductor device fabrication and energy-sensitive resist materials for use in such processes.

2. Art Background

Lithographic processes are typically employed in the manufacture of devices such as semiconductor devices. Among the lithographic processes that are available, photolithography is often utilized. Photolithographic processes have the advantage of being suitable for a blanket exposure technique. That is, a material that is sensitive to the exposing radiation is coated onto a substrate, e.g., a silicon wafer, that is being processed to form a plurality of devices. The energy-sensitive material, often referred to as a resist material, is then subjected to radiation that has been passed through a mask material so that the radiation reaching the resist delineates an image of a desired pattern therein. The pattern is then developed and transferred into the underlying substrate. Since the exposure occurs simultaneously over an entire device or a number of devices being processed on a substrate, e.g., a silicon substrate, the procedure is considered a blanket exposure.

A blanket exposure procedure is advantageous because it is relatively fast compared to other methods such as the raster scan technique that is used when the exposing radiation is a beam of electrons. However, generally, the precision of the pattern, referred to as resolution, that is obtained through a blanket exposure is reduced as the wavelength of the exposing radiation decreases. Because the trend in semiconductor devices is toward patterns with smaller features (0.5 $\mu$m to 0.35 $\mu$m to 0.25 $\mu$m to 0.18 $\mu$m), the wavelength of the exposing radiation must decrease in order to remain less than the size of the pattern features. Consequently, resist materials that are sensitive to radiation at these smaller wavelengths (i.e. wavelengths less than 300 nm), and in which patterns with acceptable resolution are developed, continue to be sought.

One class of resist materials in which acceptable pattern resolution is obtained when the wavelength of the exposing radiation is between 220 nm and 365 nm contain polymers of hydroxystyrene in which at least a portion of the hydroxyl (OH) functionality is protected by moieties which cleave from the polymer in the presence of acid. These polymers contain the following moieties:

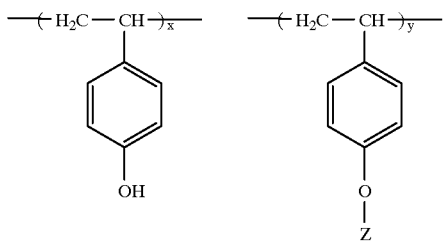

wherein Z denotes the acid sensitive moiety. These polymers are described in U.S. Serial No.08/767,493 filed Dec. 16, 1996 to Houlihan et al., which is hereby incorporated by reference.

Such polymers are combined with an energy sensitive material such as a photoacid generator (PAG) and other materials to form the resist material. When the resist material is exposed to radiation, the PAG generates an acid moiety and the Z substituent is cleaved and replaced by a hydrogen (H) atom. Thus, upon exposure to patterned radiation, there is a chemical difference between the altered polymer in the exposed region and the unaltered polymer in the unexposed region of the resist material. This chemical difference is exploited to develop a pattern that corresponds to the patterned radiation.

Although the above-described polymers have been demonstrated as useful in lithographic processes for device fabrication in which the wavelength of the exposing radiation is 248 nm, some improvement in the performance of these polymers is sought. Specifically, in order for these polymers to have a glass transition temperature ($T_g$) such that the resist material does not flow when subjected to elevated temperatures during processing, the polymers must be cross-linked to a certain extent. Typically, the number of cross-linked units in a polymer is about two to three mole percent of the units that make up the polymer. One known cross-linking unit is hydrogenated bisphenol A. Although these cross-linked polymers have an acceptable $T_g$, it is difficult to consistently produce polymers with the same degree of cross-linking. Resist polymers with moieties that hydrogen bond upon deprotection to increase the $T_g$ of the polymers upon deprotection are described in U.S. Pat. No. 4,939,070 to Brunsvold et al. However, the degree of hydrogen bonding and, thus, the Tg of the polymer, is dependent on the extent of deprotection and is therefore, difficult to control and to consistently reproduce. Therefore, a method is desired for controllably producing a resist polymer with a desirable $T_g$ that does not require cross-linking.

SUMMARY OF THE INVENTION

The present invention is directed to a process for device fabrication and an energy sensitive resist material for use in the process. The energy sensitive resist material is advantageous for use in lithographic process in which the wavelength of the exposing radiation is in the "deep UV" range, which is about 220 nm to about 350 nm.

The energy sensitive resist material contains a polymer or blend of at least two polymers. Pendant to the one polymer or distributed among the at least two polymers are three substituent groups. The first substituent is an hydroxyl group (OH). The third is a substituent group that hydrogen bonds with the first (OH) substituent. The second substituent is an acid labile group. In the context of the present invention, an acid labile group is a group that cleaves from the polymer in the presence of acid.

It is advantageous if the polymers of the present invention are substituted styrene polymers and copolymers of substituted styrene and other monomers such as, by way of example, acrylate monomers and maleimide monomers. Substituted styrene polymers and copolymers of substituted styrene and other monomers are widely used in energy sensitive resist materials and are well known to one skilled in the art. Substituted styrene polymers are described in U.S. Pat. No. 4,491,628 to Ito et al. which is hereby incorporated by reference.

The relative amounts of the three substituent groups on the polymers is controlled to provide the resist material with a glass transition temperature ($T_g$) that is equal to or greater than the temperature at which the resist material containing the polymer is baked after being patternwise exposed to radiation. This baking step is referred to as post-exposure bake or post-bake. In lithographic processes for device fabrication, the post-exposure bake temperature is typically about 60° C. to about 130° C. The resist material is typically baked prior to patternwise exposure to radiation. This baking step is referred to as the pre-exposure bake or pre-bake. The pre-bake temperature is also about 60° C. to about 130° C. There is no requirement that the $T_g$ of the unexposed resist material exceed the pre-bake temperature.

For ease of description, the polymers are described in terms of the individual monomeric units that form the polymer. For example, a hydroxystyrene polymer which has recurrent acid-labile pendant groups is described in terms of the mole percent of the OH-substituted styrene units relative to the mole percent of the acid-labile substituted styrene units.

In the embodiment of the present invention wherein the substituents are present on a single polymer, at least 20 mole percent of the units that make up the polymer have an acid labile group pendant thereto, less than about 78 mole percent but at least about 5 mole percent of the units that make up the polymer are hydroxy-substituted units, and about two mole percent to about fifteen mole percent of the units that make up the polymer are substituted with a group that hydrogen bonds to an OH group. A greater minimum amount of hydroxystyrene units (about 15 mole percent to about 30 mole percent) is required in those instances where a significant number of the OH substituents are sterically constrained from proximity to the 5 substituents that would otherwise hydrogen bond with those OH substituents.

In one embodiment all of the units in the polymer backbone are substituted styrene units (the substituents are prescribed in the preceding paragraph). In other embodiments, maleimides and acrylates, are incorporated into the polymer backbone. The resulting polymers are substituted in the manner prescribed above. If the hydroxyl substituted units are acrylic acid, the relative amount of these units in the polymer must be limited due to the higher acidity of the carboxylic acid moiety therein (compared to the phenolic moiety of the hydroxystyrene units).

It is advantageous if the resist material is a blend of polymers in which the desired substituents are distributed among the polymers. In a preferred embodiment, two of the three desired substituents are on the first polymer and the third desired substituent (and one of the other two substituents) is present on the second polymer. In this regard, at least about 20 mole percent of the polymer blend are units with acid labile substituents pendant thereto. The number of units with hydroxyl substituents is less than 78 mole percent. The number of units with substituents that form hydrogen bonds with the hydroxyl substituent is about 2 mole percent to about 15 mole percent. Furthermore, in order to ensure that the polymers are adequately miscible, the number of hydroxyl substituents on the individual polymer or polymers that make up the blend does not exceed 80 mole percent.

Although the present invention contemplates polymer blends in which each polymer contains three or more different units (terpolymers, tetrapolymers, etc.) it is advantageous if each polymer is a copolymer. One skilled in the art will appreciate that it is easier to control the relative amounts of two substituents on a polymer than the relative amounts of three or more substituents.

Since the glass transition temperature of the polymer increases with the number of hydrogen bonds that form between the first polymer and the second polymer, it follows that the amount of the second monomer that is added to the resist material to provide the resist with the desired $T_g$ will depend upon the molecular weight of the second polymer and the number of moieties on the second polymer that form hydrogen bonds with moieties on the first polymer.

The above described polymer or polymer blend is combined with a PAG and other additives, if desired, to form the energy sensitive resist material. The amount of PAG is about 0.2 weight percent to about 20 weight percent based on the weight of the polymer. The amount of PAG incorporated into a particular resist is determined by the nature of the acid labile group being cleaved, since some cleave more easily than others. One skilled in the art will readily ascertain the amount of PAG that is needed in a particular resist formulation. In certain embodiments of the present invention, the energy sensitive resist material contains additives in addition to the polymer and the PAG. Examples of suitable additives include triphenylimidazole.

In the process of the present invention, the above-described energy sensitive resist material is combined with a suitable solvent and applied onto the substrate using conventional expedients such as spin-coating. The relative amounts of solvent and energy-sensitive material that are combined are well known to one skilled in the art. After the resist material is applied onto the substrate, it is typically baked at a temperature of about 60° C. to about 130° C. to evaporate the remaining solvent from the resist film. It is advantageous if the thickness of the resulting energy-sensitive film is about 0.2 μm to about 3 μm.

The energy-sensitive resist material is then patternwise exposed to radiation. The wavelength of the exposing radiation is about 220 nm to about 365 nm. The dose of the exposing radiation is about 5 mJ/cm$^2$ to about 250 mJ/cm$^2$. The dose of the exposing radiation that is required also depends on the nature of the acid labile group. The image introduced into the energy sensitive resist material corresponds to a desired pattern, that, after development, is transferred into the underlying substrate. Both pattern development and pattern transfer are accomplished using conventional expedients well known to one skilled in the art.

DETAILED DESCRIPTION

As previously noted, the present invention is directed to an energy-sensitive resist material and a lithographic process for device fabrication in which the energy-sensitive resist material is used. The energy-sensitive material contains a polymer or a blend of polymers that are selected to provide the resist material with advantageous properties. In this regard, the polymer or polymer blend has at least three substituents thereto. The first of these substituents is a hydroxyl (OH) group. The second of these substituents is an acid-sensitive or acid labile group which is cleaved in the presence of acid and replaced by an OH group. The third of these substituents forms hydrogen bonds with the first group. The ratio of OH substituents relative to the substituents that hydrogen bond to the OH substituents (mole percent) is about 40:1 to at least about 1:1.

The relative amounts of these three moieties are selected to provide the polymer with desirable properties. Specifically, the relative amounts of the first and third moieties (the OH groups and the moieties that hydrogen bond thereto) are selected to provide the resist material that contains the polymer or polymer blend with a desired glass transition temperature ($T_g$). The amount of the second moieties (the acid labile moieties) is selected to provide adequate contrast between the resist material that is exposed to radiation and the resist material that is not exposed to radiation. One skilled in the art will appreciate the desired degree of contrast that is required between the exposed resist and the unexposed resist in order to develop a pattern in aqueous base developer solution that meets the processing requirements for lithographic processes for device fabrication.

The polymer produced has a glass transition temperature, $T_g$, that is higher than the temperature at which the resist material is baked after being exposed to radiation. In processes for device fabrication, this post-exposure bake temperature is at least about 60° C., and preferably at least about 115° C. Post exposure bake temperatures of less than about 60° C. are undesirable because, at such temperatures, reproducible results are not obtained. Since the $T_g$ of a polymer film varies depending upon the baking temperature and baking time, the $T_g$s specified herein are $T_g$s that are obtained when the polymer films are spun onto a wafer and heated to about 115° C. for about 90 seconds (to evaporate the solvent).

It is advantageous if the resist polymer has a $T_g$ of at least about 100° C. and preferably at least about 115° C. If the $T_g$ is substantially lower than the given limit, there is a tendency for the resist to flow during subsequent processing, thus degrading image quality. Generally, with monomers such as the substituted styrenes described herein, suitable $T_g$'s are obtained.

In the resist material of the present invention, substituents are pendant to the one polymer or distributed among the polymers in the blend to provide a resist material with desirable properties. In the embodiment of the present invention wherein the substituents are present on a single polymer, that polymer is at least 20 mole percent substituted styrene units wherein the substituent is an acid labile group, less than about 78 mole percent but at least about five mole percent (provided that steric considerations do not mandate a higher lower limit) substituted styrene units wherein the substituent is a hydroxyl group, and about two mole percent to about fifteen mole percent substituted units wherein the substituent is a group that hydrogen bonds with the hydroxyl group.

It is advantageous if the resist material is a blend of polymers in which the desired substituents are distributed among the polymers. In a preferred embodiment, two of the three desired substituents are on the first polymer and the third desired substituent (and one of the other two substituents) is present on the second polymer. In this regard, at least about 20 mole percent of the polymer blend are units with acid labile substituents pendant thereto. The number of units with hydroxyl substituents is less than 78 mole percent. The number of units with substituents that form hydrogen bonds with the hydroxyl substituent is about 2 mole percent to about 15 mole percent. Furthermore, in order to ensure that the polymers are adequately miscible, the number of hydroxyl substituents on the individual polymer or polymers that make up the blend does not exceed 80 mole percent.

In one embodiment of the present invention, the resist material contains a blend of two copolymers. The first polymer in the blend has the following general structure:

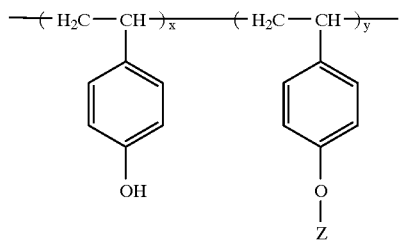

wherein Z denotes the acid sensitive moiety. Examples of suitable Z moieties have the following structure:

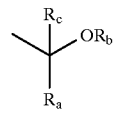

wherein $R_a$ and $R_c$ are selected from the group consisting of hydrogen, methyl, ethyl, t-butyl, and other alkyl moieties or cycloalkyl moieties wherein the number of carbon atoms is eight or less, and $R_b$ is selected from the group consisting of methyl, ethyl, t-butyl, isopropyl and other alkyl moieties or cycloalkyl moieties wherein the number of carbon atoms is eight or less. In the acetal moieties, one of either $R_a$ or $R_c$ are hydrogen. In the ketal moieties, neither $R_a$ nor $R_c$ are hydrogen. Another example of suitable Z moieties include dihydropyran derivatives having the structure:

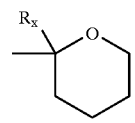

wherein $R_x$ is H if the Z moiety is an acetal and alkyl or cycloalkyl as previously described if the Z moiety is a ketal. Yet another example of suitable Z moieties are derivatives of dihydrofuran with the following structure:

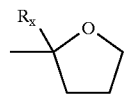

wherein $R_x$ is an alkyl or cycloalkyl moiety as previously described.

In one embodiment of the present invention, the polymer is a copolymer of hydroxystyrene and styrene with an acid labile substituent (i.e. x+y=1 in the above-illustrated polymer). However, it is contemplated that the polymer will be a terpolymer or a tetrapolymer (i.e. x+y<1). If the polymer is a terpolymer or a tetrapolymer, the other units that make up the polymer are units such as maleimides and acrylates, which are readily copolymerized with the substituted styrene monomers using conventional techniques well known to one skilled in the art.

In an alternative embodiment, the previously described acid sensitive polymer is crosslinked. Crosslinking provides an acid sensitive polymer with increased thermal stability. Crosslinking is obtained by incorporating acetal or ketal moieties into the polymer. Crosslinked polymers with acid labile acetal or ketal moieties, and methods for preparing such polymers, are described in Schacht, H., et al., "Acid Labile Crosslinked Units: A New Concept for Deep-UV Photoresists," *Journal of Photopolymer Science and Technology*, Vol. 9(4), pp. 573–586 (1996), which is hereby incorporated by reference. As described in Schacht et al., such polymers are formed by reacting a copolymer of 4-hydroxystyrene and 4-vinylcyclohexanol with a vinyl ether after which some of the hydroxy functionality on both the hydroxystyrene and vinyl cyclohexanol moieties is replaced by acetal or ketal moieties.

Whether the cross-linking moiety is an acetal or a ketal depends upon the specific vinyl ether selected. Examples of suitable vinyl ethers include ethylvinyl ether, t-butylvinyl ether and dihydropyran. In the embodiment of the present invention in which the acetal or ketal cross-linking moieties are present in the polymer, the amount of these cross-linking moieties incorporated into the polymer backbone is about 0.25 mole percent to about 5 mole percent of the repeat units that make up the polymer backbone. Since the cross-link is formed between the acid sensitive acetal or ketal moieties, the cross-linking is reversed when the resist material is exposed to radiation.

The second polymer is a hydroxystyrene polymer in which a number of the hydroxyl (OH) moieties have been replaced by substituents that form hydrogen bonds with the hydroxyl substituents. Examples of suitable substituents include carboxyl substituents, RCOO—, wherein R is an alkyl moiety having at least one but no more than about eight carbon atoms, a cycloalkyl moiety having no more than about eight carbon atoms, or substituted benzyl and phenyl moieties wherein the substituent groups are either alkyl groups with eight or less carbon atoms or halo (e.g. fluoro and chloro) groups. Further examples of R include oxygenated alkyls wherein the total number of carbon atoms is eight or less. Examples of suitable oxygenated alkyls include $-CH_2-O-(CH_2)_n-CH_3$ and $-CH_2-O-(CH_2-O)_n-CH_3$ wherein n is 0 to 6. In one embodiment of the present invention, the second polymer is copolymer of acetoxystyrene and hydroxystyrene.

The resist material of the present invention is formed by combining the above-described polymer with the previously described PAG and nitrogen-containing base in a suitable solvent therefore. Such solvents are well known to one skilled in the art. The resist material contains about 5 weight percent to about 30 weight percent polymer relative to the amount of solvent combined with the resist material. The amount of PAG in the resist material is about 0.2 weight percent to about 20 weight percent relative to the amount of polymer in the resist material. The amount of nitrogen-containing base in the resist material is about 0.02 weight percent to about 2 weight percent based on the amount of polymer in the resist material.

The resulting resist should form a continuous pinhole-free coating on the substrate to be treated. For example, in the case of a silicon-based substrate, such as a processed silicon device wafer, the subject resists form excellent coatings. Typically, the thickness of the polymer coating utilized is in the range of about 0.2 $\mu$m to about 3 $\mu$m, preferably about 0.3 $\mu$m to about 1 $\mu$m. Thinner coatings are difficult to maintain pinhole free. Additionally, in thicker coatings the resolution is generally inferior since the delineation of narrow features results in the production of narrow columns in the developed pattern that tend to deform. Thicker layers also lead to greater absorption with a resulting degradation in image quality.

An appropriate optical density in the wavelength range to be used for exposure significantly enhances resist quality. Too low an optical density results in inefficient absorption of the exposing radiation and in unnecessarily long exposure times. Too high an optical density does not permit sufficient light to reach the regions of the film furthest removed from its ambient/polymer film interface. This incomplete exposure tends to degrade resist image quality. In general, it is desirable to employ an optical density that is preferably less than 0.5 Au/$\mu$m for at least 30 percent of the actinic radiation that reaches the polymer at the exposure wavelength.

The optical density depends on the concentration of the absorbing species in both the polymer and the acid generator. Thus, once a suitable thickness for the resist material is chosen, the resist composition is adjusted to provide the desired optical density. For thicknesses as previously discussed in connection with film continuity, if the desired optical density is maintained, useful results are attained.

The resolution and sensitivity obtained depend on the average molecular weight (defined by Billmeyer, *Textbook of Polymer Science*, p. 6, 1971, J. Wiley and Sons) of the polymer, the distribution of the molecular weight, and the relative proportion of the imaging moiety in the polymer in relative to the other moieties in the monomer. For relatively high sensitivities, it is generally desirable to employ polymers with molecular weights greater than 1,000, preferably greater than 2,500 and dispersivities below 10, preferably below 4. (Dispersivity as defined in Billmeyer, supra, p. 6.) Molecular weights greater than $5 \times 10^6$ and dispersivities larger than 10 are not desirable because polymer solubility and resist contrast will be reduced, respectively. The molecular weight of the polymer is determined by the polymerization reaction conditions such as initiator, monomer concentration, and temperature. These parameters are interrelated and a control sample is utilized to determined the specific conditions necessary to yield the desired molecular weight.

In the process of the present invention, the above-described resist material is applied onto a substrate, typically a silicon wafer. The above-described resist is combined with a suitable solvent, such as propylene glycol methyl ether acetate, and applied onto the substrate using a conventional technique such as spin coating. An image of a pattern is delineated into the resist material via a patternwise exposure. The wavelength of the exposing radiation is in the range of about 220 nm to about 365 nm. It is advantageous if the wavelength is in the range of about 220 nm to about 300 nm. The radiation dose is in the range of about 5 mJ/cm$^2$ to about 250 mJ/cm$^2$. Prior to the exposing step, the resist is baked at a temperature in the range of about 60° C. to about 130° C.

After the exposure step, the resist is baked to accelerate the rate at which the acid sensitive moieties are removed from the polymer. In the embodiment of the present invention wherein the acid sensitive moiety is the acetal derived from t-butyl vinyl ether, a post exposure baking step is not required because these moieties cleave from the polymer at an acceptable rate at room temperature in the presence of acid. In the embodiment of the present invention wherein the acid sensitive acetal and ketal moieties have an activation energy more than that of the acetal moiety derived from t-butyl vinyl ether, a post exposure bake step is contemplated as useful to accelerate the removal of these acid sensitive moieties (removal is typically referred to as deprotection). The rate of deprotection increases with increasing temperature. If a post exposure bake step is required, temperatures in the range of about 60° C. to about 130° C. for at least about 30 seconds are contemplated as suitable. After the post exposure bake, the pattern is developed using a conventional aqueous base developer such as tetramethylammonium hydroxide. After development, the pattern is transferred into the underlying substrate using a conventional plasma etch expedient.

The following examples are provided to further illustrate certain embodiments of this invention.

EXAMPLE 1

A polymer of hydroxystyrene wherein a portion of the hydroxyl functionality is masked or protected by reacting the polyhydroxystyrene with ethylvinyl ether. Specifically, polyhydroxystyrene (16 g; 133.3 mmol) was placed in a round bottomed flask and dissolved in tetrahydrofuran (THF) (67 g) at room temperature. (Polyhydroxystyrene was obtained from Nippon Soda). A solution (0.1% w/w) of para-toluene sulfonic acid (TSA) (0.22 g; 0.00128 mmol) in THF and vacuum distilled ethyl vinyl ether (4.27 g; 22.24 mmol) was added to the flask and the contents stirred for 16 hours at room temperature. The reaction liquid was neutralized by adding pyridine (2 mL) and by passing it through a tetramethylammoniumhydroxide (TMAH)-activated ion exchange resin column. The polymer was recovered from the reaction liquid by precipitation in distilled water in a blender (1 part liquid per eight parts water; 500 mL water). The precipitated polymer was filtered and washed thoroughly with water. The polymer was dried under vacuum for 16 hours at 80° C. The resulting copolymer was 61 mole percent hydroxystyrene and 39 mole percent ethyl vinyl ether styrene (P(HS/EVES)). The THF, ethylvinylether, p-TSA and pyridine were obtained from the Aldrich Chemical Co. The TMAH was obtained from Alfa Aesar.

A copolymer of hydroxystyrene and acetoxystyrene was prepared by dissolving, in a round bottom flask, polyhydroxystyrene (8.58 g; 71.5 mmol) in THF (30 g). Pyridine (1.7 g; 21.5 mmol) was added to the polyhydroxystyrene solution. Acetic anhydride (3.5 g; 34.28 mmol) and additional pyridine (2.12 mL; 26.8 mmol) were then added to the reaction flask. The flask was then placed in a 55° C. bath for 120 minutes. The polymer was recovered from the reaction liquid by precipitation in distilled water in a blender (1 part solution per 8 parts water in 500 mL of water). The precipitated polymer was dried in a vacuum oven for 16 hours at 80° C. The acetic anhydride was obtained from the Aldrich Chemical Co. The resulting copolymer (P(HS/ACS)) was 50 mole percent hydroxystyrene and 50 mole percent acetoxystyrene.

The protected copolymer of hydroxystyrene and ethylvinyl ether (HS/EVE) and the copolymer of hydroxystyrene and acetoxystyrene (HS/ACS) were combined to form resist materials. The two polymers were combined in the weight ratios of 3:1; 4:1; and 5:1. In the HS/EVE copolymer, a number of the hydroxyl moieties pendant to the aromatic ring were reacted with ethylvinyl ether and the hydrogen atoms of a portion of the hydroxyl groups are replaced by alkyl ether moieties. In the HS/ACS copolymer, a number of the hydroxyl moieties pendant to the aromatic ring were reacted with acetic anhydride and the hydrogen atoms of a portion of the hydroxyl groups are replaced by alkyl carbonyl moieties. For ease of description, the polymers are described in terms of the relative amounts of the hydroxyl, alkyl ether, and alkyl carbonyl moieties present on the polymers in the blend.

In Table 1 below, the properties of the three polymer blends are described. Specifically, the relative amounts of the hydroxyl, alkyl ether, and alkyl carbonyl moieties in the blend are expressed in mole percent, since virtually all of the units that make up the polymer have one of these three moieties pendant thereto. The $T_g$, deprotection temperature, and decomposition temperature of the polymer blends are also reported in Table 1. The $T_g$ of the material was measured by dissolving the resist materials containing the polymers (prepared as described below) in a solvent (propylene glycol methyl ether acetate), spinning the solution onto silicon wafers and heating the resulting films to 115° C. for 90 seconds. The films were then scrapped off of the wafer and subjected to thermal analysis. The thermal analysis was obtained from differential scanning calorimetry using a Perkin-Elmer DSC-7 differential scanning calorimeter interfaced with a TAC 7 thermal analysis controller and a PE-7700 data station. The samples were heated from 30° C. to 450° C. at a heating rate of 10° C. per minute.

The chemical composition of the polymers was determined using $^{13}C$ NMR on a JEOL GX-500 NMR spectrometer at 125 Hz. The samples were dissolved in dioxane-$d_8$ at 20 weight percent. The spectra were acquired with proton decoupling during acquisition to remove the splitting from carbon-proton couplings. The carbon 90° pulse width was 19 $\mu$s and a sweep width of 24 kHz was used.

TABLE 1

| RATIO OF HS/EVES TO HS/ACS (by weight) | COMPOSITION (mole percent) | | | $T_g$ (°C.) | Deprotection Temp. (°C.) | Decomposition Temp. (°C.) |
| --- | --- | --- | --- | --- | --- | --- |
| | HS | EVES | ACS | | | |
| 3:1 | 58.25 | 29.25 | 12.5 | 118.1 | 233.5 | 400.8 |
| 4:1 | 58.8 | 31.2 | 10 | 118.6 | 232.4 | 419.8 |
| 5:1 | 59.2 | 32.5 | 8.3 | 118.7 | 237.1 | 413.7 |
| 20:1 | 60.5 | 37.1 | 2.4 | 112.4 | 232.6 | 410 |

The $T_g$ of a resist composition which contained only the P(HS/EVES) copolymer (no HS/ACS) was 95.1° C. The $T_g$ of a resist composition which contained only the P(HS/ACS) copolymer (no P(HS/EVES)) was 123.1° C.

Resist materials were prepared by combining the above described polymer blends (94.5 weight percent) with a 2-trifluoromethyl-6-nitrobenzyl 4-methoxybenzenesulfonate PAG (5 weight percent) and triphenylimidazole (TPI)(0.5 weight percent). The combination of polymer blend, PAG, and TPI (16 weight percent) was then combined with a spinning solvent, polyglycol methylether acetate (PGMEA) (84 weight percent).

Two types of silicon wafers were used to analyze the lithographic performance of the polymer blend resist materials. Bare silicon wafers primed with hexamethyldisilazane (HMDS) in a Yield Engineering Systems, Inc. (Y.E.S.) oven and unprimed silicon wafer coated with an organic antireflective coating were used as substrates. Resist materials containing the polymer blends described in Table 1 were prepared and each resist material was applied on each type of wafer. The resist processing steps (i.e. spin, bake, and develop) were all done using a Machine Technologies Incorporated (MTI) FLEXILAB wafer track.

The thickness of the energy sensitive resist layer formed on the substrate was measured using a Nanospec AFT thickness gauge with a refractive index set at 1.56. The thicknesses of the energy-sensitive resist films formed on the substrate were all in the range of about 0.7 $\mu$m to about 0.75 $\mu$m.

The energy sensitive resist materials were exposed using a GCA XLS KrF excimer laser stepper with a 0.53 NA lens with sigma=0.74. The resist materials were softbaked at 130° C. for 60 seconds. After exposure, the resist was baked at either 115° C. for 90 seconds or 130° C. for 90 seconds.

The exposed wafers were developed using a spray/puddle process. In the spray/puddle process, developer solution was sprayed onto the wafer for ten seconds, followed by a 55 seconds of develop, rinse, and spin dry. An Hitachi Model S-6000, CD-SEM was used for linewidth measurements and a JEOL Model 5400F SEM was used for cross-section evaluation. The resolution dose for 0.25 µm lines and spaces was 51 mJ/cm$^2$.

An SEM micrograph of the pattern developed in the resist material containing the 4:1 polymer blend (61 mole percent of the units in the first polymer had hydroxyl substituents pendant thereto, the remainder were substituted with acid labile ethoxyethylether substituents; fifty mole percent of the units in the second polymer had hydroxyl substituents pendant thereto, the remainder were substituted with acetoxy substituents) was obtained. From the micrograph, the resolution of the lines and spaces was 0.2 µm. The isolated line resolution for this pattern was 0.17.

What is claimed is:

1. A process for device fabrication comprising:
    forming a layer of energy sensitive material on a substrate, wherein the energy sensitive resist material contains a blend of polymers with three substituent groups, a first substituent group, a second substituent group, and a third substituent group pendant thereto wherein the first substituent is an hydroxyl group (OH), the third is a substituent group. RCOO—, that hydrogen bonds with the first (OH) substituent, wherein at least a portion of the first substituents are pendant on a first polymer in the blend and at least a portion of the third substituents are pendant on a second polymer in the blend, and the second substituent is an acid labile group, wherein R is selected from the group consisting of alkyl moieties having at least one but no more than about eight carbon atoms, cycloalkyl moieties having no more than about eight carbon atoms, substituted benzyl and phenyl moieties wherein the substituent groups on the benzyl and phenyl moieties are selected from the group consisting of alkyl groups with eight or less carbon atoms, halo groups, and oxygenated alkyls wherein the total number of carbons is eight or less and wherein the relative amount of the first and second substituents are selected so that the glass transition temperature ($T_g$) of the energy sensitive resist composition, both prior to and after exposure to radiation in the wavelength range of about 220 nm to about 365 nm, is greater than a post-exposure baking temperature and wherein at least 20 mole percent of the substituent groups on the polymer are acid labile substituent groups;
    exposing the energy sensitive resist material to patterned radiation in the wavelength range of about 220 nm to about 365 nm, thereby introducing an image of the pattern into the energy sensitive resist material;
    baking the resist at a post-exposure baking temperature of about 60° C. to about 130° C.;
    developing the image into a pattern; and
    transferring the pattern into the underlying substrate.

2. The process of claim 1 wherein about 2 mole percent to about 15 mole percent of the units that make up the polymer blend have RCOO— substituent groups.

3. The process of claim 2 wherein the ratio of the number of OH substituents to the number of RCOO— substituents is about 40:1 to about 1:1.

4. The process of claim 3 wherein the polymer is a blend of two polymers wherein the first polymer has the structure:

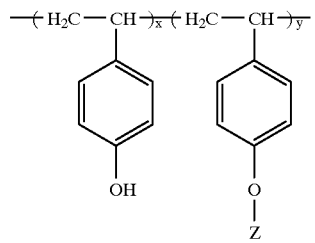

wherein x+y is less than or equal to one, Z is selected from the group consisting of:

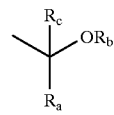

wherein $R_a$ and $R_c$ are selected from the group consisting of hydrogen, alkyl moieties, and cycloalkyl moieties wherein the number of carbon atoms in the alkyl moieties and cycloalkyl moieties is eight or less, and $R_b$ is selected from the group consisting of alkyl moieties and cycloalkyl moieties wherein the number of carbon atoms is eight or less;

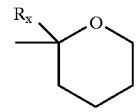

wherein $R_x$ is selected from the group consisting of H, alkyl having eight or less carbon atoms, and cycloalkyl having eight or less carbon atoms; and

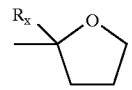

and the second polymer is a hydroxystyrene polymer in which a portion of the hydroxyl (OH) moieties have been replaced by alkylcarbonyloxy substituents.

5. The process of claim 4 wherein the second polymer is a copolymer of hydroxystyrene and acetoxystyrene.

6. The process of claim 5 wherein the total number of units with OH substituents in either polymer in the polymer blend does not exceed about 80 mole percent.

7. The process of claim 3 wherein the amount of about 5 mole percent to about 78 mole percent of the units that make up the polymer blend have OH substituent groups.

8. The process of claim 1 wherein the post exposure baking temperature is about 100° C. to about 130° C.

9. The process or claim 1 wherein the post exposure baking temperature is about 115° C. to about 130° C.

* * * * *